United States Patent
Ball et al.

(10) Patent No.: US 7,228,490 B2
(45) Date of Patent: Jun. 5, 2007

(54) ERROR CORRECTION DECODER USING CELLS WITH PARTIAL SYNDROME GENERATION

(75) Inventors: Matt Ball, Boulder, CO (US); Justin Koller, Wheat Ridge, CO (US)

(73) Assignee: Quantum Corporation, San Jose, CA (US)

( * ) Notice: Subject to any disclaimer, the term of this patent is extended or adjusted under 35 U.S.C. 154(b) by 651 days.

(21) Appl. No.: 10/782,990

(22) Filed: Feb. 19, 2004

(65) Prior Publication Data

US 2005/0188293 A1   Aug. 25, 2005

(51) Int. Cl.
*H03M 13/00* (2006.01)

(52) U.S. Cl. .................. 714/785; 714/784

(58) Field of Classification Search .......... 714/784, 714/785
See application file for complete search history.

(56) References Cited

U.S. PATENT DOCUMENTS

| | | | |
|---|---|---|---|
| 4,646,301 A | 2/1987 | Okamoto et al. | |
| 4,646,303 A | 2/1987 | Narusawa et al. | |
| 4,682,332 A | 7/1987 | Okamoto et al. | |
| 4,683,572 A | 7/1987 | Baggen et al. | |
| 4,777,635 A | 10/1988 | Glover | |
| 4,852,098 A | 7/1989 | Brechard et al. | |
| 4,852,099 A | 7/1989 | Ozaki | |
| 5,136,592 A | 8/1992 | Weng | |
| 5,285,455 A | 2/1994 | Tong et al. | |
| 5,325,373 A | 6/1994 | Iwamura et al. | |
| 5,383,204 A | 1/1995 | Gibbs et al. | |
| 5,430,739 A | 7/1995 | Wei et al. | |
| 5,444,719 A | 8/1995 | Cox et al. | |
| 5,471,485 A | 11/1995 | Tong | |
| 5,555,250 A * | 9/1996 | Walker et al. | 714/763 |
| 5,719,884 A | 2/1998 | Roth et al. | |
| 5,771,244 A | 6/1998 | Reed et al. | |
| 5,818,854 A | 10/1998 | Meyer | |
| 5,818,855 A | 10/1998 | Foxcroft | |
| 5,889,792 A | 3/1999 | Zhang et al. | |
| 5,889,793 A | 3/1999 | Sharma | |
| 5,901,158 A * | 5/1999 | Weng et al. | 714/785 |
| 5,907,564 A | 5/1999 | Jochijms et al. | |
| 5,948,117 A | 9/1999 | Weng et al. | |
| 6,041,431 A * | 3/2000 | Goldstein | 714/784 |
| 6,145,113 A | 11/2000 | Baek | |
| 6,175,945 B1 | 1/2001 | Okita | |

(Continued)

OTHER PUBLICATIONS

Search Report mailed Aug. 29, 2005, for EPO application No. 05250926.2, filed Feb. 18, 2005, 2 pages.

(Continued)

*Primary Examiner*—Albert Decady
*Assistant Examiner*—Mujtaba K. Chaudry
(74) *Attorney, Agent, or Firm*—Morrison & Foerster LLP (57) ABSTRACT

A decoder to correct errors in data includes a plurality of cells. Each cell generates a partial syndrome based on data blocks and one or more redundancy blocks. Each cell generates a partial error value based on a portion of an inverse of an error location matrix that identifies locations of any data blocks having errors. A summation logic connected to the plurality of cells generates an error value based on the partial error values generated by the plurality of cells.

46 Claims, 6 Drawing Sheets

U.S. PATENT DOCUMENTS

| | | |
|---|---|---|
| 6,195,781 B1 | 2/2001 | Kosuge |
| 6,233,710 B1 | 5/2001 | Okita |
| 6,327,690 B1 | 12/2001 | Zhang et al. |
| 6,341,297 B1 | 1/2002 | Tezuka |
| 6,341,362 B1 | 1/2002 | Golnabi |
| 6,347,389 B1 | 2/2002 | Boyer |
| 6,651,208 B1 * | 11/2003 | Tran et al. .................. 714/755 |
| 6,738,947 B1 * | 5/2004 | Maeda ....................... 714/785 |
| 6,907,559 B2 * | 6/2005 | Hall et al. .................. 714/769 |

OTHER PUBLICATIONS

Xu, Youshi et al. (Sep. 2002) "Variable Shortened-and-Punctured Reed-Solomon Codes for Packet Loss Protection," IEEE Transactions on Broadcasting, 48(3): 237-245.

* cited by examiner

ERROR CORRECTION DECODER USING CELLS WITH PARTIAL SYNDROME GENERATION

BACKGROUND

1. Field of the Invention

The present application generally relates to error correction of data using error correction codes (e.g., Bose-Chaudhuri-Hocquenghem (BCH), Reed Solomon codes, and the like), and more particularly to an error correction decoder using cells with partial syndrome generation.

2. Related Art

Error correction of data may be used in various applications, such as data storage devices, telecommunication systems, and the like. For example, in a data storage device, data is stored by writing the data to a storage medium in the storage device. The stored data can be later retrieved from the storage device by reading the data from the storage medium. However, for a number of reasons, an error may exist in the data retrieved from the storage device, meaning that the stored data cannot be retrieved or is different from the data originally stored on the storage medium. For example, a portion of the stored data on the storage medium may degenerate over time such that the portion of the stored data cannot be properly read at a later time.

Conventional error correction techniques include generating or encoding one or more redundancy blocks for data, which can be used in a decoding process to correct errors in the data. Typically the decoding process is performed using specialized hardware, which tends to be complicated and difficult to modify.

SUMMARY

In one exemplary embodiment, a decoder to correct errors in data includes a plurality of cells. Each cell generates a partial syndrome based on data blocks and one or more redundancy blocks. Each cell generates a partial error value based on a portion of an inverse of an error location matrix that identifies locations of any data blocks having errors. A summation logic connected to the plurality of cells generates an error value based on the partial error values generated by the plurality of cells. The error value corrects errors in a data block having errors.

DETAILED DESCRIPTION

The following description sets forth numerous specific configurations, parameters, and the like. It should be recognized, however, that such description is not intended as a limitation on the scope of the present invention, but is instead provided to provide a better description of exemplary embodiments.

For the sake of example, error correction of data in a storage device is described below. It should be recognized, however, that error correction can be used in various applications, including telecommunications.

Figure 1:
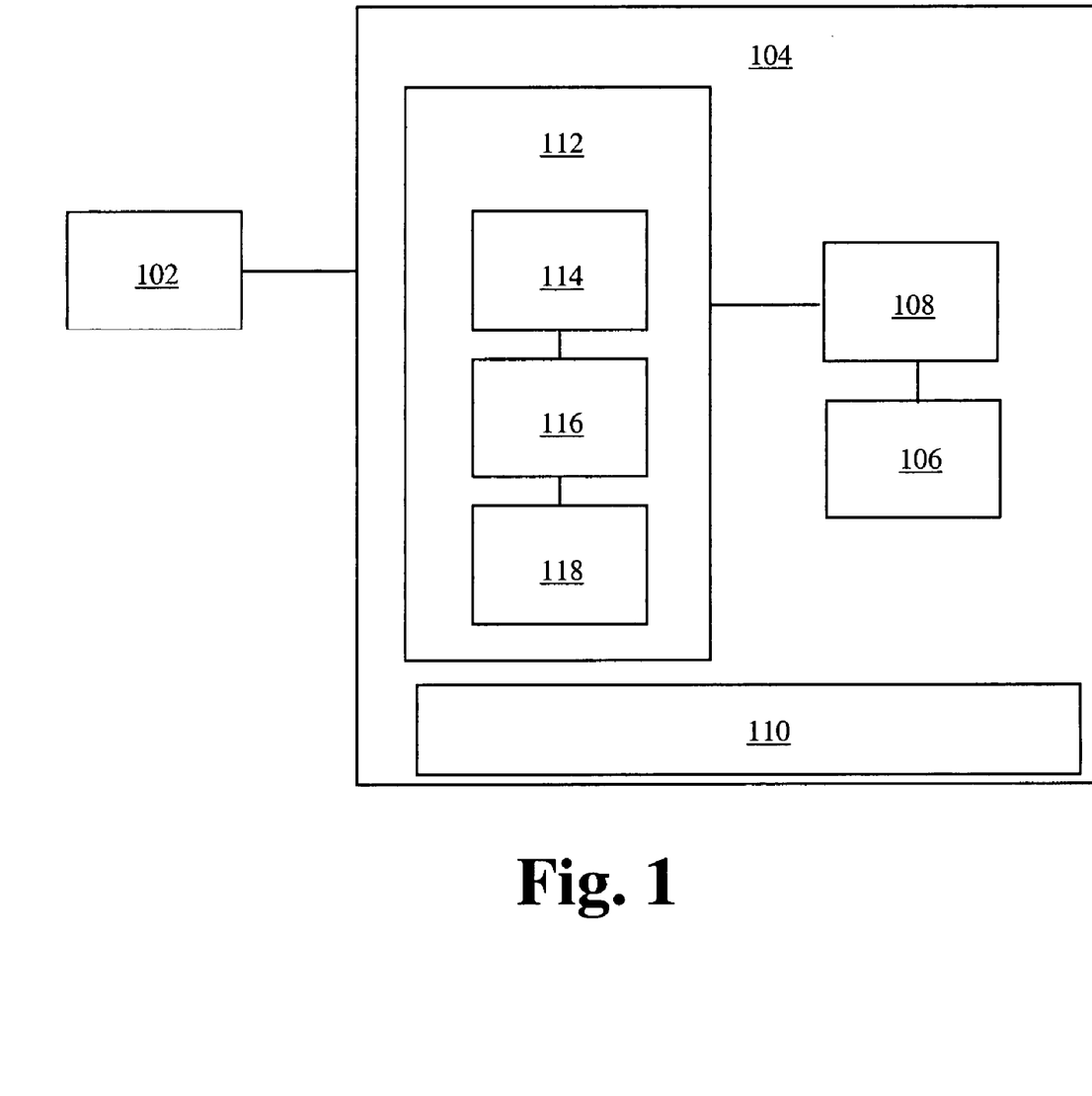
FIG. 1 depicts an exemplary host terminal connected to an exemplary storage device.

With reference to FIG. 1, a host terminal 102 is depicted connected to a storage device 104. Host computer 102 can be any type of computer, such as a personal computer, a workstation, a server, and the like. Storage device 104 can be any type of storage drive, such as a tape drive, a hard drive, and the like. It should be recognized that host terminal 102 can be connected to any number of storage devices 104, and any number of host terminals 102 can be connected to one or more storage devices 104.

With continued reference to FIG. 1, in one exemplary embodiment, storage device 104 is configured to detect and correct errors in data stored in storage device 104. More specifically, when data stored in storage device 104 is retrieved, storage device 104 is configured to use redundancy blocks, which are also referred to as error correction code (ECC) redundancy blocks, to correct errors in the retrieved data, such as if the retrieved data is different from the data that was originally stored in storage device 104 or if the stored data cannot be retrieved. Additionally, inner codes, such as cyclic redundancy checking (CRC) codes, can be used to detect errors in the retrieved data. However, it should be recognized that error correction codes, such as Reed-Solomon codes, can be used to detect as well as correct errors.

In the embodiment depicted in FIG. 1, storage device 104 includes a storage medium 106, a channel and read/write head 108, a processor 110, and an error detection/correction unit 112. In storage device 104, data is stored in storage medium 106. Read/write head 108 reads and/or writes data to storage medium 106. Processor 110 controls the operation of storage device 104, including the operation of channel and read/write head 108. As will be described in greater detail below, error detection/correction unit 112 detects and corrects errors in data stored in storage medium 106.

In the present exemplary embodiment, error detection/correction unit 112 includes a data buffer 114, a redundancy block encoder/decoder 116, and an inner code encoder/decoder 118. When data is to be stored on storage medium 106, data is received from host terminal 102 and written to data buffer 114. Redundancy block encoder/decoder 116 generates redundancy blocks for data in data buffer 114. Inner code encoder/decoder 118 generates inner codes (e.g., CRC codes, Reed-Solomon codes, and the like) for data in data buffer 114. Read/write head 108 then writes the data and the generated redundancy blocks and inner codes to storage medium 106.

When data is to be read from storage medium 106, read/write head 108 reads data, redundancy blocks, and inner codes from storage medium 106 to data buffer 114. As will be described in greater detail below, any errors in the data read from storage medium 106 are detected and corrected using the inner codes and redundancy blocks. The data may then be transferred to host terminal 102.

In the present exemplary embodiment, data is transferred between host terminal 102 and storage device 104 in data records, which are stored in a buffer. The data records are divided into data blocks of a predetermined length, such as two kbytes, four kBytes, six kbytes, and the like. It should be recognized, however, that data blocks of various lengths may be used.

After data blocks are retrieved from storage medium 106, retrieved data blocks having errors are detected, where an error in a retrieved data block indicates that the data in the retrieved data block cannot be read or is different than the data in the data block when the data block was originally stored in storage medium 106. For example, CRC codes can be used to detect when the data in the retrieved data block is different from the data in the data block when the data was originally stored in storage medium 106. More specifically, prior to storing a data block in storage medium 106, a CRC code is generated for the data block and stored with the data block in storage medium 106. When the data block is later retrieved, a new CRC code is generated for the retrieved data block. The new CRC code is then compared to the CRC code retrieved from storage medium 106, which corresponds to the retrieved data block and was originally generated for the retrieved data block before storing the retrieved data block in storage medium 106. If the new CRC code and the retrieved CRC code differ, then an error is detected for that data block. It should be recognized, however, that various types of error detection codes, including Reed-Solomon codes, may be used.

In the present exemplary embodiment, an error location matrix identifies the location of any data retrieved from the storage medium having errors. For example, an exemplary error location matrix can be expressed as:

$$\begin{bmatrix} 1 & X_0 & \ldots & X_0^{\rho-1} \\ 1 & X_1 & & X_1^{\rho-1} \\ \vdots & & \ddots & \vdots \\ 1 & X_{\rho-1} & \ldots & X_{\rho-1}^{\rho-1} \end{bmatrix},$$

where X is the location of an error and $\rho$ is the total number of data blocks and redundancy blocks in error.

In the present exemplary embodiment, the inverse of the error location matrix is generated. For example, the inverse of the exemplary error location matrix in the above example can be expressed as follows:

$$\begin{bmatrix} U_{0,0} & U_{1,0} & \ldots & U_{\rho-1,0} \\ U_{0,1} & U_{1,1} & & U_{\rho-1,1} \\ \vdots & & \ddots & \vdots \\ U_{0,\rho-1} & U_{1,\rho-1} & \ldots & U_{\rho-1,\rho-1} \end{bmatrix}.$$

Note that the error location matrix is a Vandermonde matrix, which in general requires $o(\rho^2)$ operations to compute the inverse, in comparison to general matrix inversions, which requires $o(\rho^3)$ operations. A row in a Vandermonde matrix consists of a constant value raised to incrementing powers, starting at zero. The inverse of the error location matrix can by generated by firmware or hardware using various matrix inversion techniques.

In the present exemplary embodiment, redundancy blocks are used to correct errors in the retrieved data blocks. More specifically, prior to storing data blocks in storage medium 106, redundancy blocks are generated based on the data blocks, and stored with the data blocks in storage medium 106. When the data blocks are later retrieved, data blocks identified as having errors are corrected using the redundancy blocks.

In the present exemplary embodiment, redundancy blocks are Bose-Chaudhuri-Hocquenghem (BCH) codes, and more particularly Reed-Soloman codes. For a more detailed description of Reed-Solomon codes, see Peterson & Weldon, Error Correcting Codes, 2d Edition, MIT Press, 1972, which is incorporated in its entirety herein by reference. It should be recognized, however, that various types of error correction codes may be used.

Figure 2:
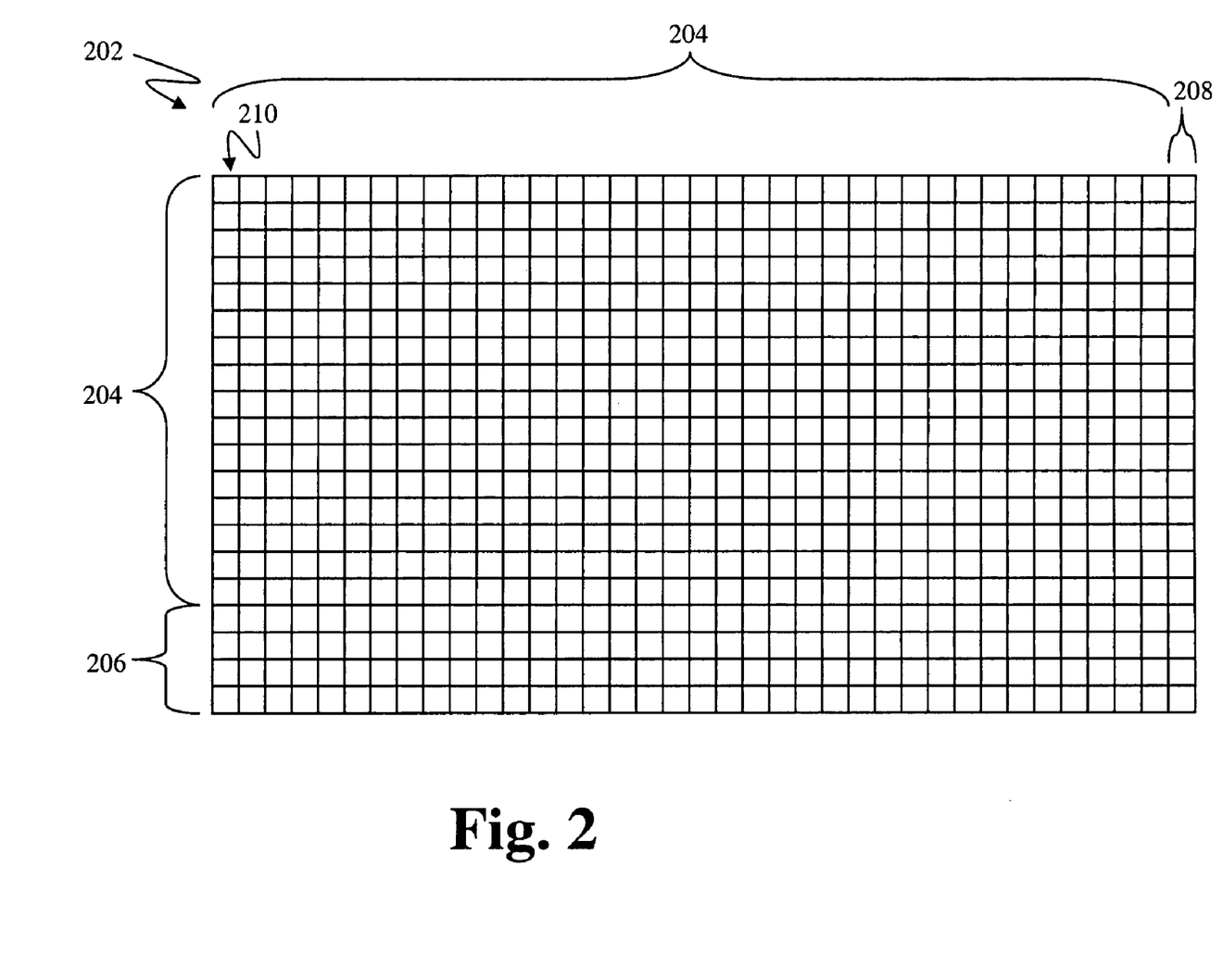
FIG. 2 depicts an exemplary entity having a set of data blocks, redundancy blocks, and cyclic redundancy checking codes.

In the present exemplary embodiment, a set of data blocks, a set of redundancy blocks, and a set of redundancy symbols of an inner code are read and written together as a group referred to as an "entity." For example, with reference to FIG. 2, an entity 202 is depicted having 16 data blocks 204, four redundancy blocks 206, and 20 redundancy symbols of an inner code 208. It should be recognized, however, that entity 202 can include various numbers of data blocks 204, redundancy blocks 206, and redundancy symbols of an inner code 208. For example, entity 202 can include 32 data blocks 204 and eight redundancy blocks 206, 112 data blocks 204 and 16 redundancy blocks 206, and the like. Additionally, redundancy symbols of an inner code 208 can both detect and correct error within a data block 204 or redundancy block 206.

FIG. 2 depicts the form in which entity 202 can be stored in data buffer 114 (FIG. 1). It should be recognized, however that entity 202 need not exist physically in the form depicted in FIG. 2. It should also be recognized that data in entity 202, and more particularly the data in a data block 204, need not correspond to a single file. Instead, in the present exemplary embodiment, data received from host terminal 102 (FIG. 1) is interleaved. As such, the data in a particular data block 204 can correspond to portions of separate files received from host terminal 102 (FIG. 1).

Figure 3:
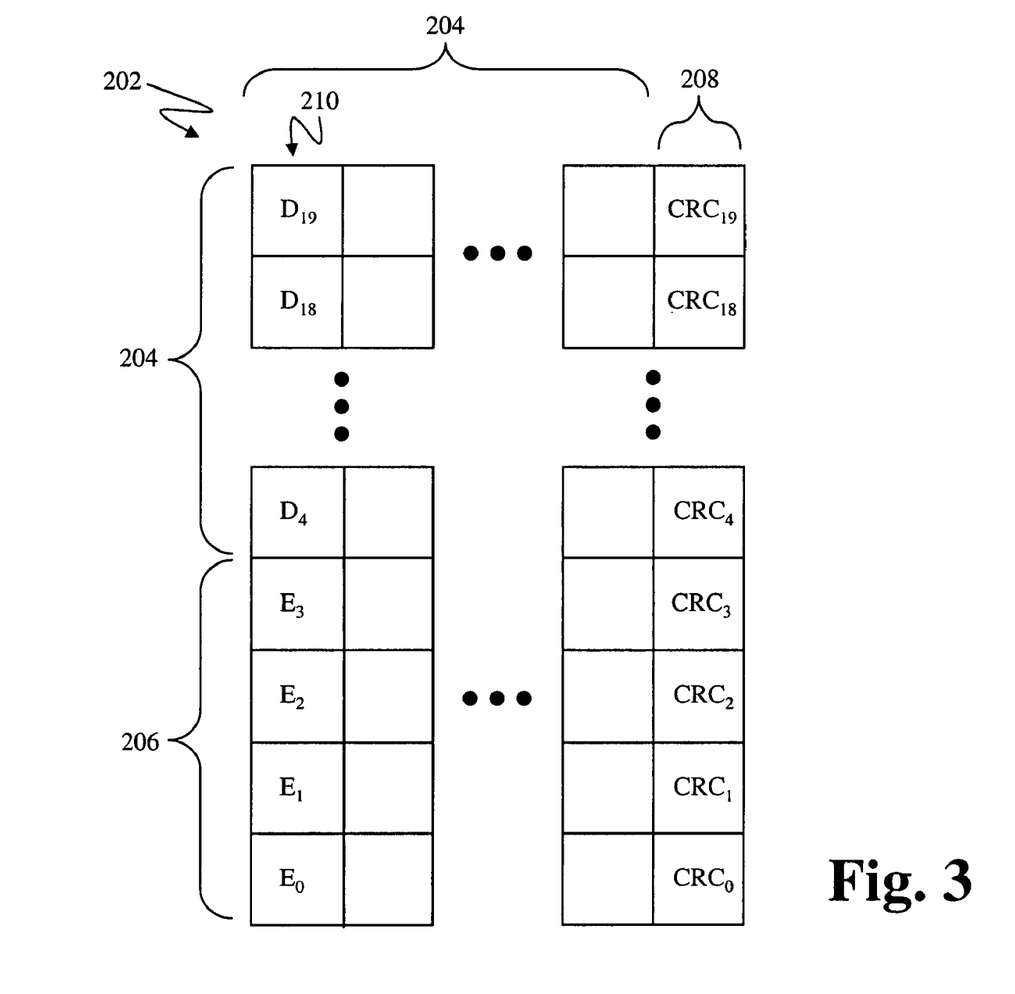
FIG. 3 depicts portions of the exemplary entity of FIG. 2.

FIG. 2 also depicts logical relationships between data blocks 204, redundancy blocks 206, and redundancy symbols of an inner code 208 of entity 202. With reference to FIG. 3, portions of entity 202 are shown in greater detail to more clearly illustrate the logical relationships between data blocks 204, redundancy blocks 206, and redundancy symbols of an inner code 208.

In FIG. 3, redundancy symbols of an inner code 208 are depicted as being CRC codes. It should be recognized, however, that various types of error detection or error correction codes can be used, such as Reed-Solomon codes.

In the present exemplary embodiment, redundancy symbols of an inner code 208 corresponds to a data block 204 or redundancy block 206 and is used to detect an error in data block 204 or redundancy block 206. For example, CRC code $CRC_{19}$ corresponds to data block $D_{19}$ of entity 202. Thus, to detect an error in data block $D_{19}$, after retrieving data block $D_{19}$ from storage medium 106 (FIG. 1), a new CRC code $CRC_{19}'$ is generated for retrieved data block $D_{19}$. The new CRC code $CRC_{19}'$ is then compared to the CRC code retrieved from storage medium 106 (FIG. 1) corresponding to retrieved data block $D_{19}$ (i.e., CRC code $CRC_{19}$). If the new CRC code $CRC_{19}'$ and the retrieved CRC code $CRC_{19}$ differ, then an error is detected for data block $D_{19}$.

In the present exemplary embodiment, the number of redundancy blocks determines the maximum number of data blocks that can be corrected. Thus, in the example depicted in FIG. 2, a total of four redundancy blocks 206 may be used to correct a maximum of four data blocks 204 in error.

In the present exemplary embodiment, each redundancy block 204 is generated based on the data in all of the data blocks of entity 202. For example, redundancy blocks $E_0$, $E_1$, $E_2$, and $E_3$ are each generated based on the data in data blocks $D_4$, $D_2$, . . . , and $D_{19}$. As described above, with reference to FIG. 1, redundancy blocks can be generated by redundancy block encoder/decoder 116. As also described above, redundancy blocks are initially generated for data received from host terminal 102. The generated redundancy blocks and the received data are then stored in storage medium 106.

With reference again to FIG. 3, although redundancy blocks $E_0$, $E_1$, $E_2$, and $E_3$ are generated based on the same set of data (i.e., data blocks 204 of entity 202), each redundancy block 206 is unique as to each other. More specifically, in the present embodiment, redundancy blocks $E_0$, $E_1$, $E_2$, and $E_3$ are Bose-Chaudhuri-Hocquenghem (BCH) codes, and more particularly Reed-Solomon codes.

With reference to FIG. 1, in the present exemplary embodiment, redundancy block encoder/decoder 116 operates as an encoder to generate redundancy blocks to be stored with data blocks in storage medium 106. Redundancy block encoder/decoder 116 operates as a decoder to correct errors in data blocks retrieved from storage medium 106. It should be recognized, however, that redundancy block encoder/decoder 116 can be implemented as separate components (i.e., an encoder component and a decoder component) in storage device 104.

Figure 4:
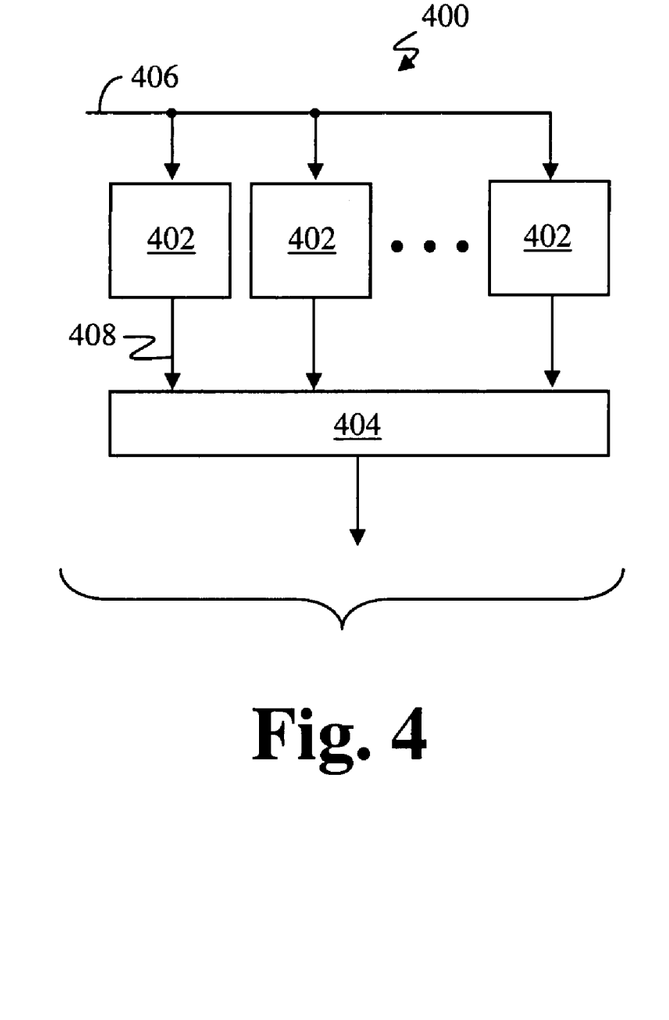
FIG. 4 depicts an exemplary decoder.

With reference now to FIG. 4, an exemplary encoder 400 to correct errors in data blocks retrieved from a storage medium is depicted. As noted above, encoder 400 can be implemented as an integrated part of redundancy block encoder/decoder 116 (FIG. 1) or as a separate component within storage device 104 (FIG. 1).

As depicted in FIG. 4, encoder 400 includes a plurality of cells 402 and a summation logic 404 connected to the plurality of cells 402. Each cell 402 generates a partial syndrome based on the data blocks and redundancy blocks retrieved from the storage medium. Each cell 402 also generates a partial error value based on a portion of the inverse of an error location matrix that identifies the locations of any data blocks retrieved from the storage medium having errors. As described above, the inverse of the error location matrix can be generated by firmware or hardware. Summation logic 404 generates an error value, which corrects errors in a data block retrieved from the storage medium, based on the partial error values generated by plurality of cells 402.

With reference to FIG. 1, as described above, data blocks and redundancy blocks retrieved from storage medium 106 are held in data buffer 114. More particularly, with reference to FIG. 2, in one exemplary embodiment, data blocks 204 and redundancy blocks 206 can be stored in data buffer 114 (FIG. 1) in the form of entity 202.

With reference again to FIG. 4, in the present exemplary embodiment, plurality of cells 402 are connected to data buffer 114 (FIG. 1) through lines 406. Each cell 402 receives as an input a portion of entity 202 (FIG. 2) stored in data buffer 114 (FIG. 1). More particularly, each cell 402 reads in portions of entity 202 (FIG. 2) in cache bursts.

With reference to FIG. 2, in the present exemplary embodiment, each cache burst is a portion of a single data block 204 or redundancy block 206. Additionally, in the present exemplary embodiment, portions of data blocks 204 and redundancy blocks 206 are read in a raster pattern.

For example, assume that each cache burst is 32 bytes long. The first 32 bytes of the first data block 204 is read in a first cache burst. The first 32 bytes of each of the next 15 data blocks 204 and four redundancy blocks 206 of entity 202 are then read in 19 subsequent cache bursts. After the first 32 bytes of the last redundancy block 206 is read, the second subsequent 32 bytes of the first data block 204 is read, and then the second subsequent 32 bytes of each of the next 15 data blocks 204 and four redundancy blocks 206 of entity 202 are read. In this manner, data blocks 204 and redundancy blocks 206 of entity 202 are read in cache bursts in a raster pattern in 32 byte portions. It should be recognized, however, that the size of the cache burst can vary, and data blocks 204 and redundancy blocks 206 can be read in various patterns. For example, each cache burst can be 64 bytes rather than 32 bytes.

In the present exemplary embodiment, a portion of each data block 204 and redundancy block 206 in entity 202 can be logically grouped as a code word 210. For example, the first portions of each data block 204 and redundancy block 206 can be logically grouped as a first code word 210, which corresponds to the first column in FIG. 2. The second byte of each data block 204 and redundancy block 206 can be logically grouped as a second code word 210, which corresponds to the second column in FIG. 2.

In the present exemplary embodiment, code word 210 is one byte wide. Thus, if data blocks 204 and redundancy blocks 206 are 2 kBytes long, then data blocks 204 and redundancy blocks 206 in entity 202 can be logically grouped into 2,000 separate, individual code words 210. Additionally, if data blocks 204 and redundancy blocks 206 are read using a cache burst of 32 bytes, which corresponds to 16 long words of 32 bits each, then portions of 32 code words 210 are read at a time.

With reference again to FIG. 4, in the present exemplary embodiment, the number of cells 402 in decoder 400 corresponds to the number of redundancy blocks 206 (FIG. 2) in entity 202, which in turn corresponds to the maximum number of data blocks 204 that can be corrected. Thus, decoder 400 can be modified based on the maximum number of data blocks 204 to be corrected. For example, when a maximum of four data blocks 204 are to be corrected, decoder 400 is modified to include four cells 402. Similarly, when a maximum of 16 or 32 data blocks 204 are to be corrected, decoder 400 is modified to include 16 or 32 cells 402.

Figure 5:
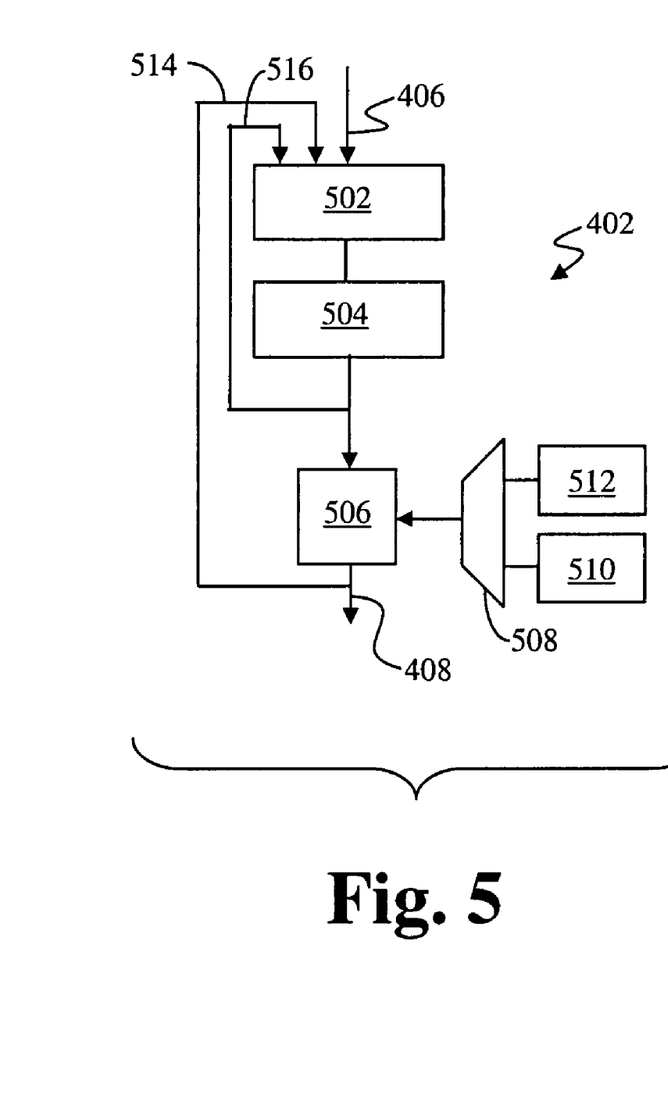
FIG. 5 depicts an exemplary cell of the exemplary decoder depicted in FIG. 4.

With reference now to FIG. 5, an exemplary cell 402 is depicted. In the present exemplary embodiment, each cell 402 includes an input logic 502, a queue 504, a multiplier 506, a multiplexer 508, and queues 510 and 512.

Figure 6:
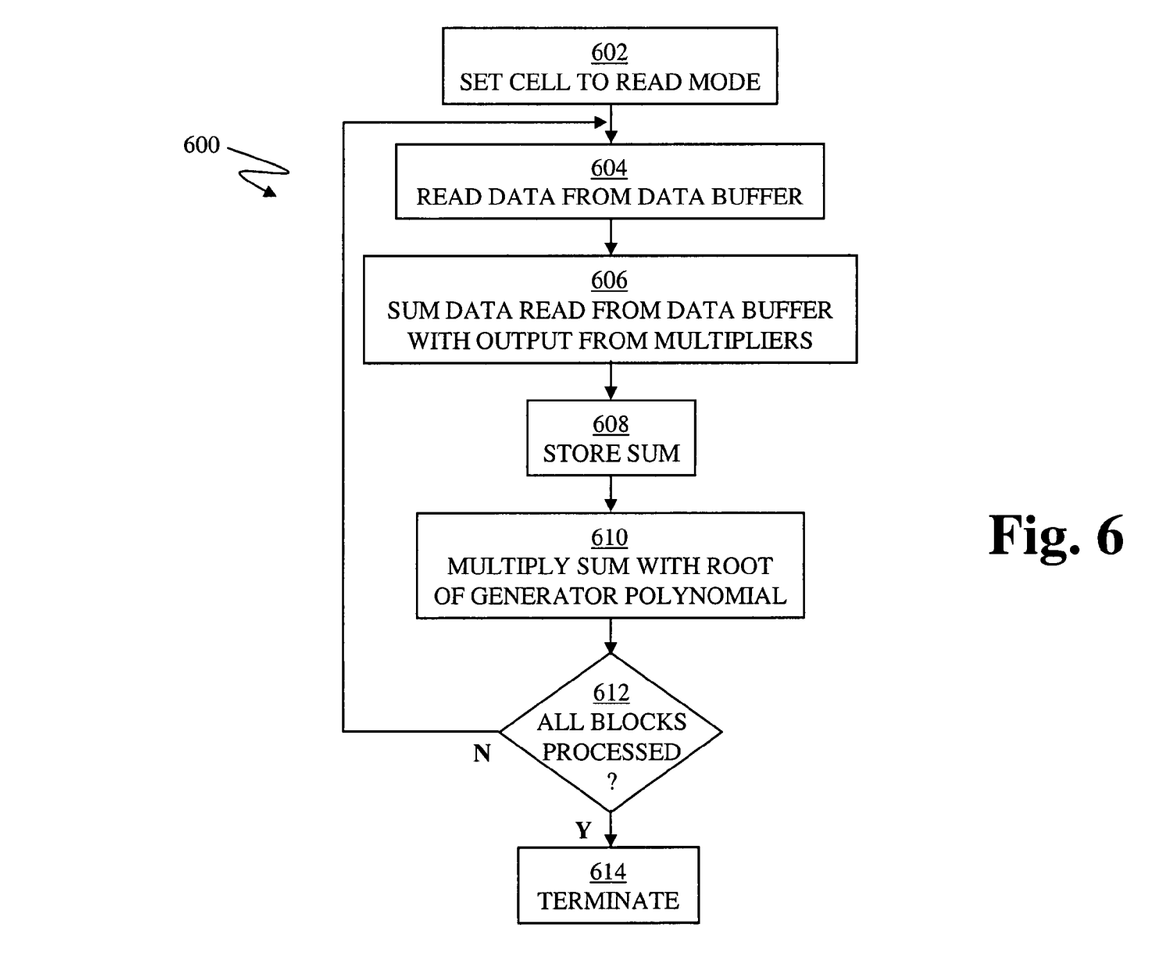
FIG. 6 depicts an exemplary read process performed by the exemplary cell depicted in FIG. 5.

As described above, each cell 402 generates a partial syndrome based on data blocks and one or more redundancy blocks retrieved from the storage medium. With reference to FIG. 6, an exemplary read process 600 of generating a partial syndrome in cell 400 (FIG. 4) is depicted.

Figure 7:
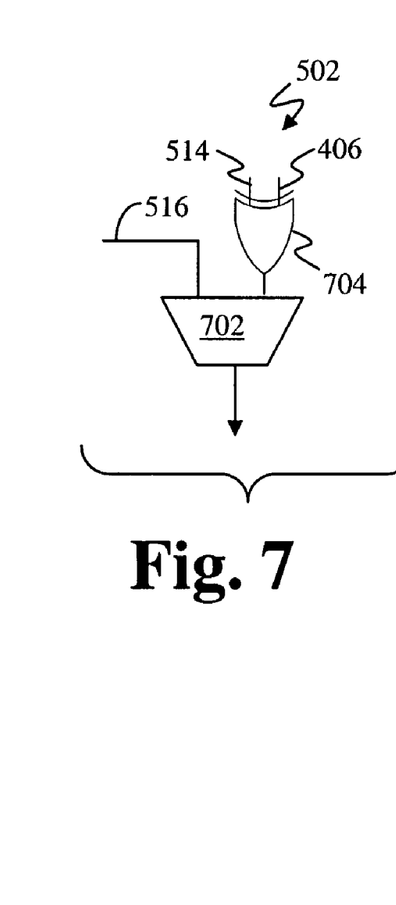
FIG. 7 depicts a portion of the exemplary cell depicted in FIG. 5.

In 602, cell 402 (FIG. 4) is set to a read mode. With reference to FIG. 5, in the present exemplary embodiment, input logic 502 is set to receive inputs from line 406, which is connected to data buffer 114 (FIG. 1), and feedback line 514, which is connected to the output of multiplier 506. More particularly, with reference to FIG. 7, multiplexer 702 is set to receive input from an XOR gate 704 connected to line 406 and feedback line 514. With reference to FIG. 5, multiplier 506 is set to receive inputs from queue 504, which holds intermediate results generated by input logic 502, and queue 510, which holds a root of a generator polynomial. More particularly, multiplexer 508 with inputs connected to queues 510 and 512 is set to receive input from queue 510.

With reference to FIG. 6, in 604, cell 402 (FIG. 4) reads data from data buffer 114 (FIG. 1). In the present exemplary embodiment, cell 402 (FIG. 4) reads in a portion of a data block or a redundancy block from entity 202 (FIG. 2) stored in data buffer 114 (FIG. 1) as a cache burst.

For example, data can be read from data buffer 114 (FIG. 1) in a cache burst of 32 bytes, which corresponds to 16 long words. With reference to FIG. 5, line 406 and feedback line 514 are 32 bits wide, which allows cell 402 to process 32 bits (one long word) at a time. It should be recognized, however, that lines 406 and feedback line 514 can be any size, and cell 402 can process any number of bits at a time.

In 606, the data read from data buffer 114 (FIG. 1) is summed with the output from multiplier 506 (FIG. 5). With reference to FIG. 5, in the present exemplary embodiment, input logic 502 performs an exclusive-OR (XOR) operation on a cache burst read from entity 202 (FIG. 2) through line 406 and the output of multiplier 506 through feedback line 514. As described above, with reference to FIG. 7, input logic 502 includes XOR gate 704, which can perform the XOR operation. It should be recognized, however, that input logic 502 can include various components, including various types and numbers of logic gates, to sum the data read from data buffer 114 (FIG. 1) with the output from multipliers 504 (FIG. 5).

With reference to FIG. 6, in 608, the sum of the data read from data buffer 114 (FIG. 1) and the output from multiplier 506 (FIG. 5) is stored as an intermediate result. With reference to FIG. 5, in the present exemplary embodiment, the intermediate result generated by input logic 502 is stored in queue 504.

In the present exemplary embodiment, the size and number of entries in queue 504 is determined based on the size of the cache burst used to read data from data buffer 114 (FIG. 1) and the size of line 406 and feedback line 514. For example, if data is read from data buffer 114 (FIG. 1) in a cache burst of 32 bytes, which corresponds to 16 long words, and line 516 and feedback line 514 are 32 bits wide, then each long word in the cache burst is summed with the output from multiplier 506 and stored as an entry in queue 504. Thus, in this example, queue 504 includes eight entries with each entry 32 bits long. If the size of the cache burst is changed, then the size of queue 504 can also be changed. For example, if the cache burst is 64 bytes long, then queue 504 can include 16 entries with each entry 32 bits long.

With reference to FIG. 6, in 610, the intermediate result is multiplied with a root of a generator polynomial. With reference to FIG. 5, in the present exemplary embodiment, multiplier 506 is a Galois Field Multiplier that performs a Galois Field multiplication between the intermediate result stored in queue 504 and a root of a generator polynomial stored in queue 510.

In the present exemplary embodiment, multiplier 506 performs multiple, parallel Galois Field multiplications. For example, if each entry of queue 504 is 32 bits long, the 32 bits of data from an entry of queue 504 can be formatted as four parallel eight bit Galois Field elements. Multiplier 506 can then perform four parallel eight-by-eight Galois Field multiplications between the 32 bit long entry from queue 504 and an eight bit root of a generator polynomial from queue 510.

With reference to FIG. 6, in 612, if all of the data blocks and redundancy blocks of entity 202 (FIG. 2) have not been processed, loop 604 to 612 is iterated to process the next data block or redundancy block. In the present exemplary embodiment, if the next data block to be processed was determined to have errors, then in 604 all zeros are read rather than reading a cache burst from data buffer 114 (FIG. 1). If all of the data blocks and redundancy blocks have been processed, read process 600 terminates at 614.

In the present exemplary embodiment, the number of iterations of loop 604 to 612 corresponds to the number of data blocks and redundancy blocks in entity 202 (FIG. 2). For example, with reference to FIG. 3, assume that portions of entity 202 are read in cache bursts of 32 bytes in length. In a first iteration of loop 604 to 612 (FIG. 6), a first cache burst containing the first 32 bytes of data block $D_{19}$ is read and processed. In a second iteration of loop 604 to 612 (FIG. 6), a second cache burst containing the first 32 bytes of data block $D_{18}$ is read and processed. Assume that data block $D_4$ was identified as having errors. Thus, in a $16^{th}$ iteration of loop 604 to 612 (FIG. 6), all zeros are read and processed rather than reading in a cache burst from data block $D_4$. In this example, loop 604 to 612 (FIG. 6) is iterated 20 times to process all 16 data blocks and four redundancy blocks.

With reference to FIG. 5, note that in the first iteration of loop 604 to 612 (FIG. 6), the result of the sum of the first cache burst and the output of the multiplier 506 is the data read in the first cache burst because queue 504 is empty and the output of multiplier 506 is zero. In the second iteration, queue 504 holds the data read in the first cache burst, and the output of multiplier 506 is the data read in the first cache burst multiplied by a root of a generator polynomial. Thus, the result of the sum of the second cache burst and the output of the multiplier 506 is the sum of the data read in the second cache burst and the result of multiplying the data read in the first cache burst by a root of a generator polynomial. This result is then stored in queue 504 as the new intermediate result. When read process 600 is terminated in 614 (FIG. 6) after all of the data blocks and redundancy blocks have been processed, the final result stored in queue 504 of each cell 402 is the partial syndrome for each cell 402.

With reference again to FIG. 4, in the present exemplary embodiment, each cell 402 uses a different root of a generator polynomial. Thus, different partial syndromes are generated in each of the plurality of cells 402.

More particularly, each cell 402 uses a root of a generator polynomial of $\alpha^n$, where n is the sequence number of the cell. For example, if there are ρ cells 402, then cells 402 can be assigned sequence numbers from zero to (ρ−1) (i.e., cell 402(0), cell 402(1), cell 402(2), . . . , cell 402 (ρ−1)). In this example, cell 402(0) uses $\alpha^0$, cell 402(1) uses $\alpha^1$, cell 402(2) uses $\alpha^2$, . . . , and cell 402(ρ−1) uses $\alpha^{(\rho-1)}$. The root of a generator polynomial can be a hardwired constant, or a register set by firmware.

While the root of a generator polynomial of the plurality of cells 402 need to be sequential, the sequence can start at any number. For example, each cell 402 can use a root of a generator polynomial of $\alpha^{n+l}$, where n is the sequence number of the cell and l is a fixed constant for each cell 402.

Because each cell 402 uses a different root of a generator polynomial, after process 600 (FIG. 6) is terminated, when all of the data blocks and redundancy blocks in entity 202 (FIG. 2) have been processed, different partial syndromes have been generated by each cell 402 and stored in the queues 504 of cells 402. For example, if there are ρ cells 402 and cells 402 are assigned sequence numbers from zero to (ρ−1) (i.e., cell 402(0), cell 402(1), cell 402(2), . . . , cell 402 (ρ−1)), cell 402(0) generates partial syndrome $S_0$, cell 402(1) generates partial syndrome $S_1$, . . . , and cell 402 (ρ−1) generates partial syndrome $S_{(\rho-1)}$.

Figure 8:
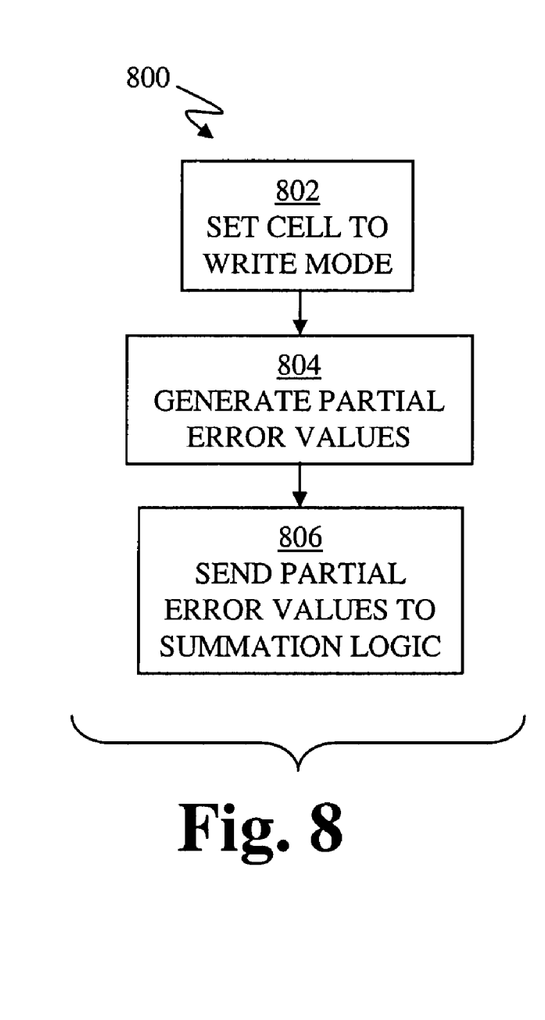
FIG. 8 depicts an exemplary write process performed by the exemplary cell depicted in FIG. 5.

After read process 600 (FIG. 6) has been terminated, each cell 402 generates a partial error value based on the generated partial syndrome and a portion of the inverse of the error location matrix. With reference to FIG. 8, an exemplary write process 800 of generating a partial error value in cell 402 (FIG. 4) is depicted.

In 802, cell 402 (FIG. 4) is set to a write mode. With reference to FIG. 5, in the present exemplary embodiment, input logic 502 is set to receive inputs from feedback line 516, which is connected to queue 504, which holds the partial syndrome generated in cell 400 during the previous read process. More particularly, with reference to FIG. 7, multiplexer 702 is set to receive input from feedback line 516. With reference to FIG. 5, multiplier 506 is set to receive inputs from queue 504 and queue 512, which holds a portion of the inverse of the error location matrix. More particularly, multiplexer 508 with inputs connected to queues 510 and 512 is set to receive input from queue 512.

As described above, an error location matrix identifies the locations of any data blocks retrieved from the storage medium having errors. For example, an exemplary error location matrix can be expressed as:

$$\begin{bmatrix} 1 & X_0 & \ldots & X_0^{\rho-1} \\ 1 & X_1 & & X_1^{\rho-1} \\ \vdots & & \ddots & \vdots \\ 1 & X_{\rho-1} & \ldots & X_{\rho-1}^{\rho-1} \end{bmatrix},$$

where X is the location of an error and $\rho$ is the total number of data blocks and redundancy blocks in error. The inverse of the error location matrix can be expressed as follows:

$$\begin{bmatrix} U_{0,0} & U_{1,0} & \ldots & U_{\rho-1,0} \\ U_{0,1} & U_{1,1} & & U_{\rho-1,1} \\ \vdots & & \ddots & \vdots \\ U_{0,\rho-1} & U_{1,\rho-1} & \ldots & U_{\rho-1,\rho-1} \end{bmatrix}.$$

As also described above, in the present exemplary embodiment, the inverse of the error location matrix can be generated by firmware or hardware.

In the present exemplary embodiment, each cell 402 uses a different portion of the inverse of the error location matrix. For example, with reference to FIG. 4, if there are $\rho$ cells 402 assigned sequence numbers from zero to ($\rho$−1) (i.e., cell 402 (0), cell 402(1), cell 402(2), . . . , cell 402 ($\rho$−1)), cell 402(0) uses the first row of the inverse of the error location matrix (i.e., $U_{0,0}$, $U_{1,0}$, . . . , $U_{\rho-1,0}$), cell 402(1) uses the second row of the inverse of the error location matrix (i.e., $U_{0,1}$, $U_{1,1}$, . . . , $U_{\rho-1,1}$), . . . , and cell 402($\rho$−1) uses the ($\rho$−1) row of the inverse of the error location matrix (i.e., $U_{0,\rho-1}$, $U_{1,\rho-1}$, . . . , $U_{\rho-1,\rho-1}$).

With reference to FIG. 5, in 804 (FIG. 8), multiplier 506 generates a partial error value by multiplying the partial syndrome, which is held in queue 504, with an element of the portion of the inverse of the error location matrix, which is held in queue 512. For example, with reference to FIG. 4, assume again that there are $\rho$ cells 402 assigned sequence numbers from zero to ($\rho$−1) (i.e., cell 402(0), cell 402(1), cell 402(2), . . . , cell 402 ($\rho$−1)). In cell 402(0), a first partial error value $y_0(0)$ can be generated by multiplying partial syndrome $S_0$ with the first element from the first row of the inverse of the error location matrix $U_{0,0}$. In cell 402(1), a second partial error value $y_0(1)$ can be generated by multiplying partial syndrome $S_1$ with the first element from the second row of the inverse of the error location matrix $U_{0,1}$. In cell 402($\rho$−1), a ($\rho$−1) partial error value $y_0(\rho-1)$ can be generated by multiplying partial syndrome $S_{(\rho-1)}$ with the first element from the ($\rho$−1) row of the inverse of the error location matrix $U_{0,\rho-1}$.

With reference to FIG. 8, in 806, the partial error value generated by cell 402 (FIG. 4) is sent to summation logic 404 (FIG. 4). With reference to FIG. 4, in the example described above, the partial error values $y_0(0)$, $y_0(1)$, . . . , and $y_0(\rho-1)$ generated by cells 402(0), 402(1), . . . , and 402($\rho$−1) are sent to summation logic 404.

To generate an error value, summation logic 404 sums the partial error values generated by cells 402. In the example described above, a first error value $Y_0$ is generated by summing the partial error values $y_0(0)$, $y_0(1)$, . . . , and $y_0(\rho-1)$ generated by cells 402(0), 402(1), . . . , and 402($\rho$−1).

Figure 9:
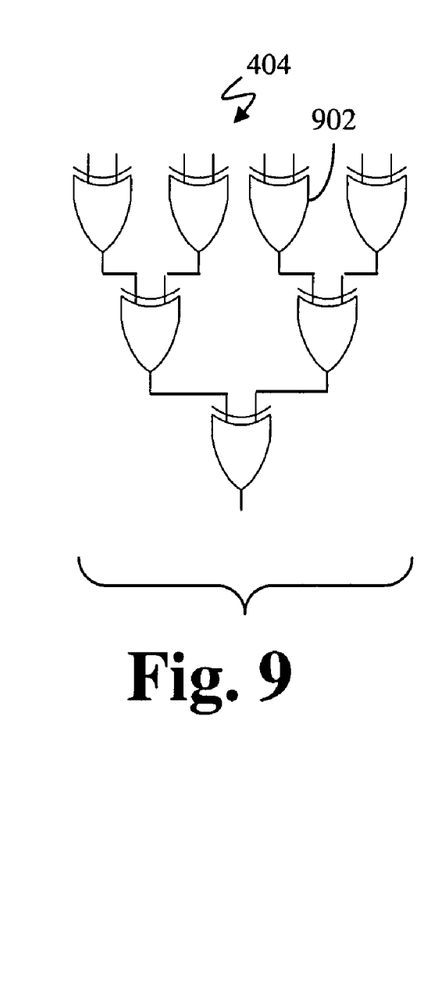
FIG. 9 depicts another portion of the exemplary cell depicted in FIG. 5.

With reference to FIG. 9, in the present exemplary embodiment, summation logic 404 can include an array of XOR gates 902 that computes the Galois Field sum of the outputs of cells 402 (FIG. 4). It should be recognized, however, that summation logic 404 can include various components, including various types and numbers of logic components, to compute the Galois Field sum of the outputs of cells 402 (FIG. 4).

The generated error value can then be written to data buffer 114 (FIG. 1) to correct the data in the location corresponding to the elements of a portion of the inverse of the error location matrix used to generate the partial error values in cells 402. With reference to FIG. 4, in the example described above, partial error values $y_0(0)$, $y_0(1)$, . . . , and $y_0(\rho-1)$ are generated in cells 402(0), 402(1), . . . , and 402($\rho$−1) using elements $U_{0,0}$, $U_{0,1}$, . . . , and $U_{0,\rho-1}$ of a portion of the inverse of the error location matrix. With reference to FIG. 3, assume for the sake of example that these elements correspond to a portion of data block $D_4$. Error value $Y_0$ can then be written to data buffer 114 (FIG. 1) to correct the portion of data block $D_4$.

With reference to FIG. 4, when the size of the cache burst is greater than the amount of data processed at a time by cell 402, during write process 800 (FIG. 8), cell 402 cycles through the cache burst to process the entire cache burst. For example, as described above, cells 402 can receive data from data buffer 114 (FIG. 1) in a cache burst of 32 bytes and process one long word of the cache burst at a time. As also described above, queue 504 (FIG. 5) can include eight entries that are each 32 bits (one long word) in length. Thus, in the example above of using element $U_{0,0}$ to generate partial error value $y_0(0)$ in cell 402(0), multiplier 506 in cell 402(0) multiplies each entry in queue 504 (FIG. 5) with element $U_{0,0}$ to produce eight sets of partial error value $y_0(0)$. Similarly, eight sets of partial error values $y_0(1)$, . . . , and $y_0(\rho-1)$ are generated in cells 402(1), . . . , and 402($\rho$−1) using elements $U_{0,1}$, . . . , and $U_{0,\rho-1}$.

Summation logic 404 also generates eight sets of error values $Y_0$, which are then written as a cache burst back to data buffer 114 (FIG. 1). For example, with reference to FIG. 3, assume elements $U_{0,0}$, $U_{0,1}$, . . . , and $U_{0,\rho-1}$, correspond to the first 32 bytes of data block $D_4$, which corresponds to the first 32 code words of data block $D_4$, the eights sets of error values $Y_0$ are written to the correct the first 32 bytes of data block $D_4$.

With reference to FIG. 5, write process 800 (FIG. 8) can then be iterated to generate another set of partial error values, which can be summed to generate another error value, which can then be used to correct a portion of another data block with errors. For example, in a second iteration, a second set of partial error values are generated and summed to generate a second error value.

More particularly, with reference to FIG. 4, in the second iteration of 804 (FIG. 8), in cell 402(0), a first partial error value $y_1(0)$ can be generated by multiplying partial syndrome $S_0$ with the second element from the first row of the inverse of the error location matrix $U_{1,0}$. In cell 402(1), a second partial error value $y_1(1)$ can be generated by multiplying partial syndrome $S_1$ with the second element from the second row of the inverse of the error location matrix $U_{1,1}$. In cell 402($\rho$-1), a ($\rho$-1) partial error value $y_0(\rho-1)$ can be generated by multiplying partial syndrome $S_{(\rho-1)}$ with the second element from the ($\rho$-1) row of the inverse of the error location matrix $U_{1,\rho-1}$.

In the second iteration of 806 (FIG. 8), the second set of partial error values $y_1(0), y_1(1), \ldots,$ and $y_1(\rho-1)$ generated by cells 402(0), 402(1), ..., and 402($\rho$-1) are sent to summation logic 404. A second error value $Y_1$ is then generated by summing the partial error values $y_1(0), y_1(1), \ldots,$ and $y_1(\rho-1)$.

By iterating write process 800 (FIG. 8) and summing the generated sets of partial error values, error values can be generated to correct portions the data blocks identified as having error. The number of times write process 800 (FIG. 8) is iterated and the number of error values generated can be determined based on the number of data blocks identified as having errors (i.e., $\rho$). Alternatively, the number of times write process 800 (FIG. 8) is iterated and the number of error values generated can be set to the maximum number of data blocks that can be corrected, which corresponds to the number of redundancy blocks in entity 202 (FIG. 2).

After write process 800 (FIG. 8) has been completed, read process 600 (FIG. 6) can be iterated again to process another portion of the data blocks and redundancy blocks stored in data buffer 114 (FIG. 1), and then write process 800 (FIG. 8) can be iterated again to correct errors in another portion of the data blocks having errors. In the present exemplary embodiment, before iterating read process 600 (FIG. 6) again, queue 504 (FIG. 5) is cleared.

For example, with reference to FIG. 3, assume that portions of entity 202 are read in cache burst of 32 bytes in length. Read process 600 (FIG. 6) is iterated to read and process the first 32 bytes of each data block 204 and each redundancy block 206 to generate partial syndromes. Write process 800 (FIG. 8) is then iterated to generate error values and correct errors in the first 32 bytes of any data blocks 204 having errors. Queue 504 (FIG. 5) is cleared, then read process 600 (FIG. 6) is iterated again to read and process the second 32 bytes of each data block 204 and each redundancy block 206 to generate another set of partial syndromes. Write process 800 (FIG. 8) is then iterated again to generate error values and correct errors in the second 32 byte of any data blocks 204 having errors. In this manner, all the portions of each data block 204 and redundancy block 206 are read and processed using read process 600 (FIG. 6), and all the portions of any data block having errors is corrected using write process 800 (FIG. 8).

Although exemplary embodiments have been described, various modifications can be made without departing from the spirit and/or scope of the present invention. For example, with reference to FIG. 4, although decoder 4 has been described in connection with a storage device, it should be recognized that decoder 4 can be used in connection with various devices and in various applications where data is received through a channel that introduces error, such as part of a telecommunication system. Therefore, the present invention should not be construed as being limited to the specific forms shown in the drawings and described above.

We claim:

1. A decoder to correct errors in data, comprising:
a plurality of cells, each cell configured to generate a partial syndrome based on data blocks and one or more redundancy blocks, and to generate a partial error value based on the partial syndrome and a portion of an inverse of an error location matrix that identifies locations of any data blocks having errors; and
a summation logic connected to the plurality of cells, the summation logic configured to generate an error value based on the partial error values generated by the plurality of cells, wherein the error value corrects errors in one of the data blocks.

2. The decoder of claim 1, wherein the number of cells in the plurality of cells is equal to the number of redundancy blocks.

3. The decoder of claim 1, wherein each cell includes:
an input logic;
a first queue connected to the input logic; and
a multiplier connected to the input logic and the first queue.

4. The decoder of claim 1, wherein each cell operates in a read mode to generate the partial syndrome.

5. The decoder of claim 4, wherein when a cell operates in a read mode, the input logic of the cell is set to receive inputs from the multiplier and a data buffer that holds the data blocks and one or more redundancy blocks.

6. The decoder of claim 5, wherein the input logic generates a sum of the inputs from the multiplier and the data buffer, and wherein the sum is stored in the first queue.

7. The decoder of claim 6, wherein the input logic includes an exclusive-or (XOR) gate with inputs connected to the data buffer and the multiplier and an output connected to the first queue to generate the sum.

8. The decoder of claim 6, wherein when the cell operates in the read mode, the multiplier is set to receive a root of a generator polynomial and the sum from the first queue.

9. The decoder of claim 8, wherein the multiplier is a Galois Field multiplier that performs a Galois Field multiplication between the root of a generator polynomial and the sum.

10. The decoder of claim 9, wherein the multiplier comprises a plurality of Galois Field multipliers to perform multiple, parallel Galois Field multiplications between the root of a generator polynomial and the sum.

11. The decoder of claim 8, wherein each cell in the plurality of cells is set to receive a different root of a generator polynomial to generate different partial syndromes.

12. The decoder of claim 8, wherein the root of a generator polynomial is a hardwired constant or a register set by firmware.

13. The decoder of claim 8, further comprising:
a second queue that holds the root of a generator polynomial; and
a multiplexer having an input connected to the second queue and an output connected to the multiplier, wherein the multiplexer is set to connected the second queue to the multiplier when the cell operates in the read mode.

14. The decoder of claim 4, wherein each cell operates in a write mode to generate the partial error value.

15. The decoder of claim 14, wherein when a cell operates in a write mode, the input logic of the cell is set to receive inputs from the queue that holds the partial syndrome generated by the cell during the read mode.

16. The decoder of claim 15, wherein the multiplier is a Galois Field multiplier that performs a Galbis Field multiplication between the partial syndrome and the element of the portion of the inverse of the error location matrix.

17. The decoder of claim 16, wherein the multiplier comprises a plurality of Galois Field multipliers to perform multiple, parallel Galois Field multiplications between the partial syndrome and the element of the portion of the inverse of the error location matrix.

18. The decoder of claim 14, wherein each cell in the plurality of cells is set to receive a different portion of the error location matrix to generate different partial error values.

19. The decoder of claim 14, further comprising:
a third queue that holds the portion of the error location matrix; and
a multiplexer having an input connected to the third queue and an output connected to the multiplier, wherein the multiplexer is set to connected the third queue to the multiplier when the cell operates in the write mode.

20. The decoder of claim 1, wherein the summation logic includes an array of XOR gates.

21. The decoder of claim 1, wherein the inverse of the error location matrix is generated by firmware or hardware.

22. The decoder of claim 1, wherein the decoder is a component of a data storage device, and wherein the data blocks and one or more redundancy blocks are retrieved from a storage medium and held in a data buffer in the data storage device.

23. A data storage device configured to correct errors in data retrieved from a storage medium, comprising:
a data buffer configured to hold data blocks and one or more redundancy blocks retrieved from the storage medium; and
a decoder connected to the data buffer, the decoder having:
a plurality of cells that access the data blocks and one or more redundancy blocks held in the data buffer, each cell configured to generate a partial syndrome based on the retrieved data blocks and one or more redundancy blocks, and to generate a partial error value based on the partial syndrome and a portion of an inverse of an error location matrix; and
a summation logic connected to the plurality of cells, the summation logic configured to generate an error value based on the partial error values generated by the plurality of cells, wherein the error value corrects errors in a data block.

24. The data storage device of claim 23, wherein the number of cells in the plurality of cells is equal to the number of redundancy blocks retrieved from the storage medium.

25. The data storage device of claim 23, wherein each cell includes:
an input logic;
a first queue connected to the input logic;
a multiplier connected to the input logic and the first queue;
a second queue connected to the multiplier, wherein the second queue holds a root of a generator polynomial; and
a third queue connected to the multiplier, wherein the third queue holds the portion of the inverse of the error location matrix.

26. The data storage device of claim 25, wherein each cell operates in a read mode to generate the partial syndrome, and operates in a write mode to generate the partial error value.

27. The data storage device of claim 26, wherein when a cell operates in the read mode:
the input logic of the cell generates a sum of inputs received from the multiplier and the data buffer, and stores the sum in the first queue; and
the multiplier multiplies the root of a generator polynomial from the second queue and the sum from the first queue.

28. The data storage device of claim 27, wherein when the cell operates in the write mode:
the input logic of the cell receives the sum from the first queue; and
the multiplier multiplies the sum held in the queue and an element of the portion of the inverse of the error location matrix held in the third queue.

29. The data storage device of claim 28, wherein each cell in the plurality of cells is set to receive a different root of a generator polynomial to generate different partial syndromes, and a different portion of the inverse of the error location matrix to generate different partial error values.

30. The data storage device of claim 28, wherein the multiplier comprises a plurality of Galois Field multipliers to perform multiple, parallel Galois Field multiplications.

31. The data storage device of claim 23, wherein the summation logic includes an array of exclusive-or (XOR) gates.

32. The data storage device of claim 23, wherein the inverse of the error location matrix is generated by firmware or hardware.

33. A method of correcting errors in data, comprising:
receiving data blocks and one or more redundancy blocks;
generating an inverse of an error location matrix with locations of any received data blocks with errors;
generating a plurality of partial syndromes in a plurality of cells of a decoder, wherein each one of the plurality of partial syndromes are generated in each one of the plurality of cells based on the received data blocks and one or more redundancy blocks;
generating a plurality of partial error values in the plurality of cells, wherein each one of the plurality of partial error values are generated in each one of the plurality of cells based on a partial syndrome and a portion of the inverse of the error location matrix; and
generating an error value based on the plurality of partial error values generated by the plurality of cells.

34. The method of claim 32, wherein the received data blocks and one or more redundancy blocks are held in a data buffer, and wherein generating a plurality of partial syndromes comprises:
in each of the plurality cells:
a) reading data from the data buffer;
b) generating a sum of the data read from the data buffer with an output from a multiplier;
c) storing the sum;
d) multiplying the sum with a root of a generator polynomial; and
e) iterating steps a) to d) to process all the data blocks and one or more redundancy blocks held in the data buffer, wherein the sum is the partial syndrome when all the data blocks and one or more redundancy blocks held in the data buffer have been processed.

35. The method of claim 34, wherein the number of iterations of steps a) to d) of claim 34 is equal to the number of data blocks and redundancy blocks held in the data buffer.

36. The method of claim 34, wherein in iterating step a), when data is to be read from a data block having errors, reading all zeros rather than the data from the data block having errors.

37. The method of claim 34, wherein multiplying the sum with a root of a generator polynomial comprises:
performing multiple, parallel Galois Field multiplications between the root of a generator polynomial and the sum using a plurality of Galois Field multipliers.

38. The method of claim 34, wherein generating a plurality of partial error values comprises:
after steps a) to e) of claim 34 are completed, in each of the plurality cells:
f) multiplying the partial syndrome with an element of the portion of the inverse of the error location matrix to generate a partial error value; and
g) sending the partial error value to be summed with the partial error values generated by each of the plurality of cells.

39. The method of claim 38, further comprising:
h) summing the partial error values generated by each of the plurality of cells to generate an error value; and
i) writing the error value to the data buffer to correct a data block having errors.

40. The method of claim 39, further comprising:
j) repeating steps f) and g) and steps h) and i) to correct another data block having errors.

41. The method of claim 40, wherein the number of iterations of steps f) to g) and steps h) and i) is equal to the number of data blocks having errors.

42. The method of claim 40, wherein the number of iterations of steps f) to g) and steps h) and i) is equal to the number of redundancy blocks held in the data buffer.

43. The method of claim 40, wherein the sum is cleared and steps a) to e), steps f) and g), steps h) and i), and step j) are repeated to process another portion of the data blocks and one or more redundancy blocks held in the data buffer.

44. The method of claim 38, wherein multiplying the partial syndrome with an element of the portion of the inverse of the error location matrix comprises:
performing multiple, parallel Galois Field multiplications between the partial syndrome and the element of the portion of the inverse of the error location matrix using a plurality of Galois Field multipliers.

45. The method of claim 33, wherein receiving data blocks and one or more redundancy blocks comprises retrieving data blocks and one or more redundancy blocks from a storage medium of a data storage device.

46. The method of claim 33, wherein the inverse of the error location matrix is generated by firmware or hardware.

* * * * *